(12) United States Patent
Goebel et al.

(10) Patent No.: US 7,795,615 B2
(45) Date of Patent: Sep. 14, 2010

(54) CAPACITOR INTEGRATED IN A STRUCTURE SURROUNDING A DIE

(75) Inventors: Thomas Goebel, Fishkill, NY (US); Erdem Kaltalioglu, Newburgh, NY (US); Sun-Oo Kim, Hopwell Junction, NY (US)

(73) Assignee: Infineon Technologies AG, Munich (DE)

( * ) Notice: Subject to any disclaimer, the term of this patent is extended or adjusted under 35 U.S.C. 154(b) by 997 days.

(21) Appl. No.: 11/268,854

(22) Filed: Nov. 8, 2005

(65) Prior Publication Data

US 2007/0102787 A1    May 10, 2007

(51) Int. Cl.
*H01L 23/58* (2006.01)

(52) U.S. Cl. .................... 257/48; 257/E23.149; 438/18; 324/765

(58) Field of Classification Search .................. 257/48; 438/14, 17, 18
See application file for complete search history.

(56) References Cited

U.S. PATENT DOCUMENTS

| | | | |
|---|---|---|---|
| 5,789,302 A | 8/1998 | Mitwalsky et al. | |
| 6,018,448 A * | 1/2000 | Anthony | 361/56 |
| 6,025,639 A | 2/2000 | Mitwalsky et al. | |
| 6,084,287 A | 7/2000 | Mitwalsky et al. | |
| 6,261,945 B1 | 7/2001 | Nye, III et al. | |
| 6,271,578 B1 | 8/2001 | Mitwalsky et al. | |
| 6,383,893 B1 | 5/2002 | Begle et al. | |
| 6,400,015 B1 * | 6/2002 | Fraser et al. | 257/730 |
| 6,451,664 B1 | 9/2002 | Barth et al. | |
| 6,709,954 B1 | 3/2004 | Werking | |
| 6,734,090 B2 | 5/2004 | Agarwala et al. | |
| 7,098,676 B2 | 8/2006 | Landers et al. | |
| 2003/0032263 A1 * | 2/2003 | Nagao et al. | 438/462 |
| 2004/0004241 A1 | 1/2004 | Aton | |
| 2004/0129938 A1 | 7/2004 | Landers et al. | |
| 2005/0026397 A1 | 2/2005 | Daubenspeck et al. | |
| 2005/0110118 A1 | 5/2005 | Udupa et al. | |
| 2005/0225333 A1 * | 10/2005 | Talanov et al. | 324/663 |
| 2006/0220250 A1 | 10/2006 | Kim et al. | |
| 2007/0221613 A1 | 9/2007 | Gutsche et al. | |
| 2009/0160020 A1 | 6/2009 | Barth et al. | |

* cited by examiner

*Primary Examiner*—W. David Coleman
(74) *Attorney, Agent, or Firm*—Slater & Matsil, L.L.P.

(57) ABSTRACT

An integrated circuit comprises a chip including a circuit area surrounded by a peripheral area, the peripheral area extending to an edge of the chip. The integrated circuitry is disposed within the circuit area. No active circuit is disposed within the peripheral area. A barrier is disposed within the peripheral area and surrounds the circuit area. The barrier includes a capacitor structure integrated therein.

25 Claims, 10 Drawing Sheets

CAPACITOR INTEGRATED IN A STRUCTURE SURROUNDING A DIE

TECHNICAL FIELD

This invention relates generally to semiconductor devices and methods, and more particularly to capacitors integrated in a structure surrounding a die and methods for fabricating the same.

BACKGROUND

One of the goals of the semiconductor industry is to shrink the size of a semiconductor device while increasing its functionality and performance. A large number of electronic devices like cell phones, cameras, and computers use semiconductor devices. The smaller, faster, and more high-performance the device, the better the consumer product that it serves. Fitting in more components in a smaller area on the device is one of the ways of achieving this goal. Using novel low-k dielectric materials to increase the speed of the device is another way.

When using low-k dielectric materials, moisture penetration and consequent degradation of the low-k material can be a problem. Using a double moisture barrier overcomes this problem. Further, low-k materials are fragile; the dicing operation, which severs the device from the wafer it sits on, may initiate cracks in the material that propagate and cause device failure during operation. Using a crackstop overcomes this problem. Combining the crack stop and double moisture barrier into one structure serves to decrease the size of the device, while maintaining its reliability. Such a structure is shown in U.S. Pat. Pub. 2004/0129938, which is incorporated herein by reference.

Another application of this approach has been to provide a crackstop that also serves to enhance substrate noise isolation as discussed in U.S. Pat. Pub. 2005/0110118, which is incorporated herein by reference. Providing a double crackstop structure, with the first structure being comprised of thin metal layers providing high resistance and the second structure being comprised of thick metal layers providing mechanical strength serves the dual purpose of mechanical integrity with reduced substrate noise.

SUMMARY OF THE INVENTION

In a first embodiment, an integrated circuit includes a chip with a circuit area surrounded by a peripheral area. The peripheral area extends to an edge of the chip. Integrated circuitry is formed within the circuit area and no active circuit is disposed within the peripheral area. A barrier is formed within the peripheral area. The barrier at least partially surrounds the circuit area and preferably includes a capacitor structure integrated therein.

In another embodiment, an integrated circuit includes a chip with a circuit area surrounded by a peripheral area that again extends to an edge of the chip. Integrated circuitry is formed within the circuit area and no active circuit is disposed within the peripheral area. A barrier is formed within the peripheral area. The barrier at least partially surrounds the circuit area and includes a first electrode coupled to the integrated circuitry and a second electrode coupled to the integrated circuitry.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a capacitor in a crackstop and/or moisture barrier inside a semiconductor device. The invention may also be applied, however, to other structures along or near the periphery of a semiconductor device that may provide capacitance. In other embodiments, other passive structures, such as inductors as just one example, can be included in the surrounding structure.

Throughout this discussion, the terms crackstop and moisture barrier are used to describe a structure surrounding an integrated circuit. In preferred embodiments, a capacitor is integrated into one or both of these structures. It is understood that the concepts of the invention discussed with respect to crackstops and moisture barriers (or scribe seals) can be applied to any structure that surrounds or partially surrounds a semiconductor die. Accordingly, the term barrier is intended to include any structure along the periphery of a semiconductor die and that surrounds or partially surrounds active circuitry in the die.

In one aspect, the present invention provides a capacitor integrated in a structure that surrounds a semiconductor device. The embodiment allows for high capacitance while providing a barrier to moisture or preventing the propagation of cracks. While the barrier functionality in this scenario may be less than that of a full barrier tower, as for instance, in prior art U.S. Pat. Pub. 2004/0129938, the structure with this barrier will include additional electrical advantages. These electrical advantages often outweigh any physical barrier disadvantages that may occur. Other embodiments of the present invention are capacitors integrated with a crackstop (or scribe seal), wherein the capacitors are present only along part of the crackstop.

Figure 1:
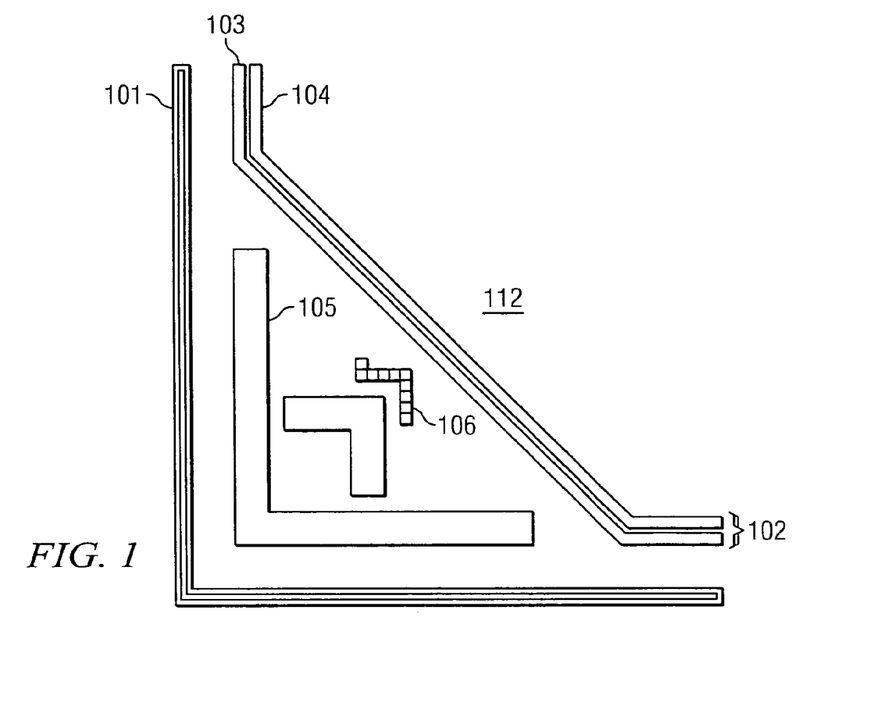
FIG. 1 is an illustration of a crackstop and double moisture barrier on the surface of a semiconductor device.

FIG. 1 shows a top down view of a corner of a semiconductor device. In particular, this figure shows a crackstop 101 and a moisture/oxidation barrier 102 that includes an outer barrier tower 103 and an inner barrier tower 104. The figure also shows that alignment marks can be included in the arrangement. For example, a global alignment mark 105 and a FIB (focused ion beam) alignment mark 106 are included in the corner of the chip between the crackstop 101 and the moisture barrier 102. While not explicitly illustrated below, embodiments of the present invention can also include alignment marks arranged in the periphery of the chip.

In the device FIG. 1, beginning at the diced edge of a semiconductor device and moving inwards towards the circuit region 112 that includes the active circuitry (i.e., moving from left to right in the figure), there is illustrated in sequence: crackstop 101 formed on the device substrate and moisture barrier 102 comprising the two towers 103 and 104 formed on the device substrate. The illustration also shows the moisture barrier towers 103 and 104 being chamfered at the corner, and alignment marks 105 and 106 being placed between 101 and 102.

Figure 2:
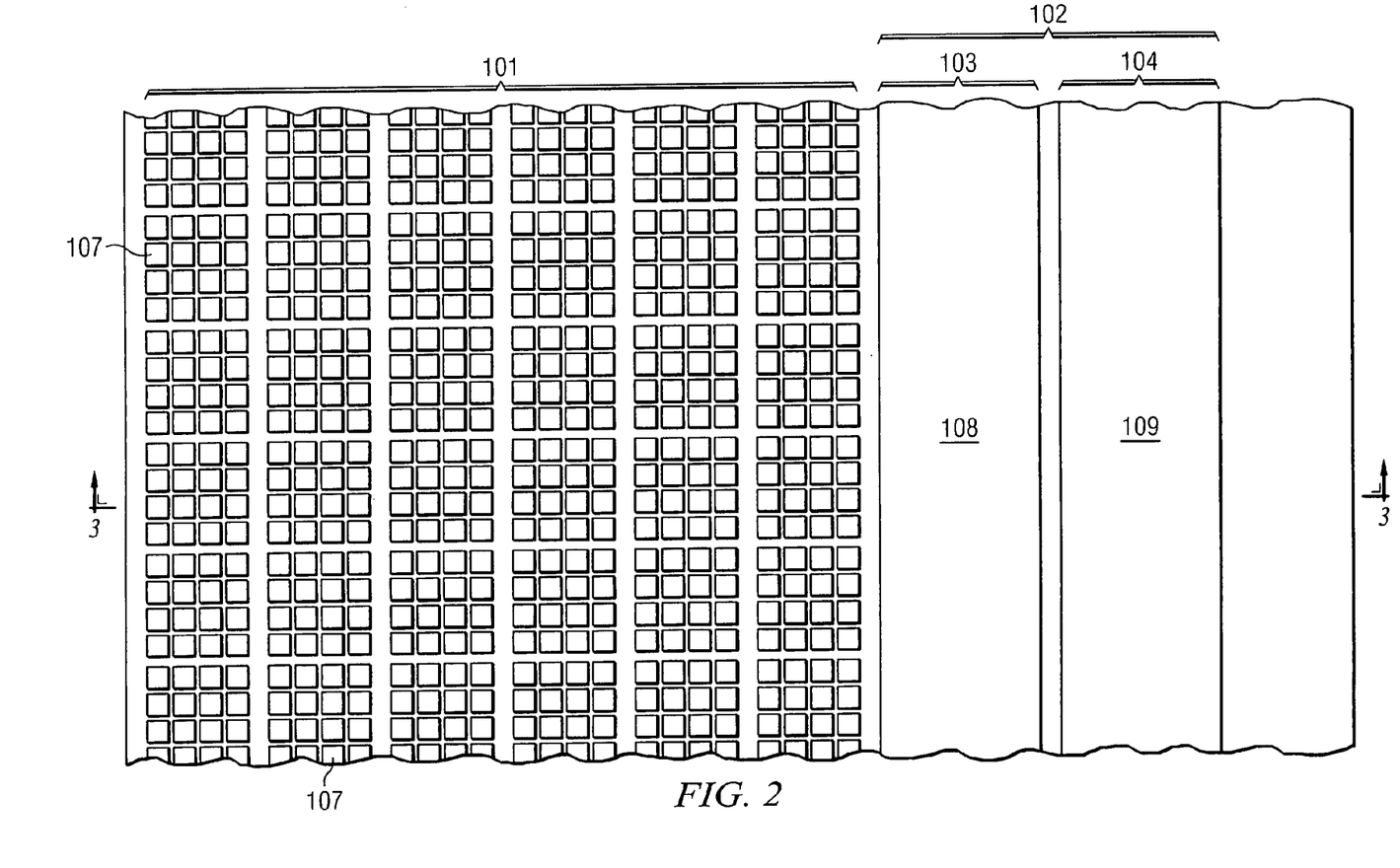
FIG. 2 is a top down high magnification schematic of the vias in the crackstop and moisture barrier for a device.

FIG. 2 shows a plan view of a magnified portion of the structures in FIG. 1 (although not to scale). In this view, the topmost metal has not been illustrated so as to expose the vias in the crackstop structure 101. In particular, the crackstop 101 includes plates 107 that serve as crack arrestors. In contrast, moisture barrier towers 103 and 104 comprise continuous lines 108 and 109 to serve as barriers to moisture or oxidants.

Figure 3:
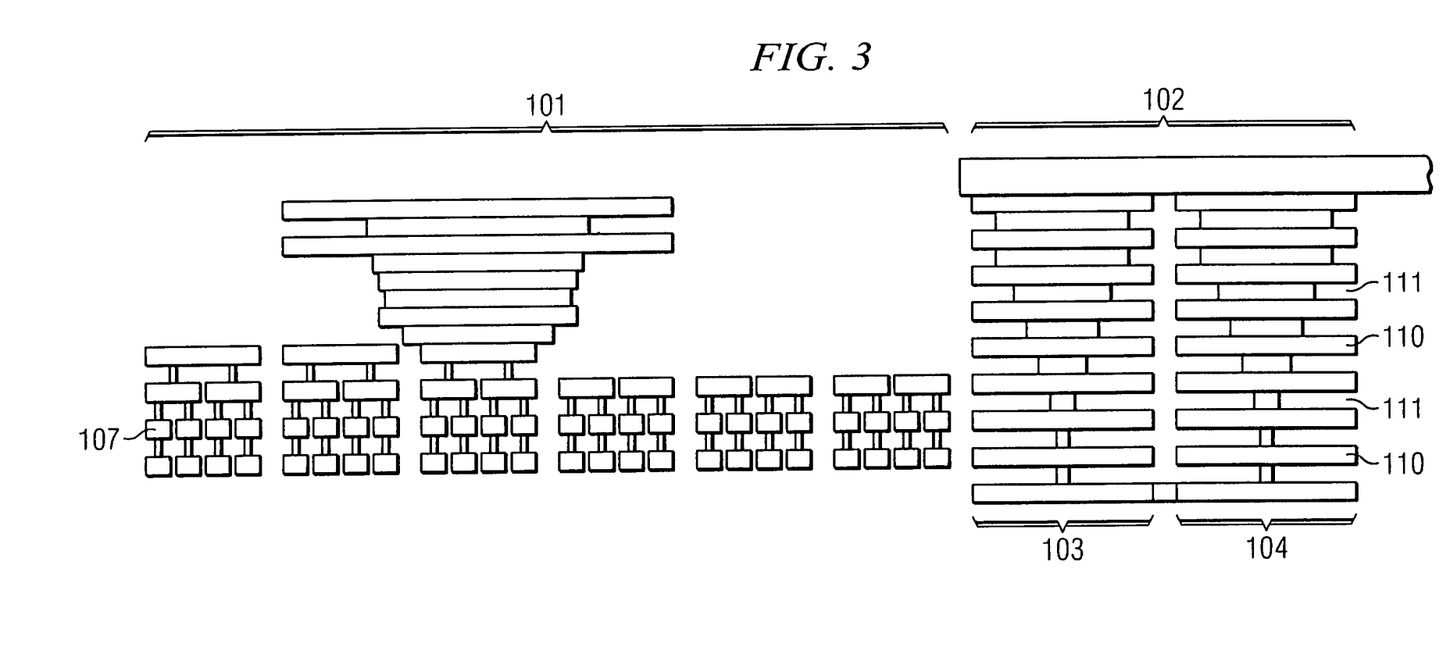
FIG. 3 is an illustration of the cross-sectional view of the crackstop and double tower moisture barrier of FIG. 2.

FIG. 3 is a cross-sectional view of FIG. 1 or FIG. 2, showing the structures in 101 and 102. These structures are formed from alternating levels of metal lines 110 and vias 111. Comparing FIG. 3 with FIG. 2, it can be seen that FIG. 2 shows a plan view of the metal 1 or metal 2 (where the metal levels begin counting from the bottom of the structure) in the crackstop 101 and the two moisture barrier towers 103 and 104. In this structure, the thickness of the vias 111 decreases away from the top surface of the device, while the pitch of the metal lines 110 decreases.

Figure 4:
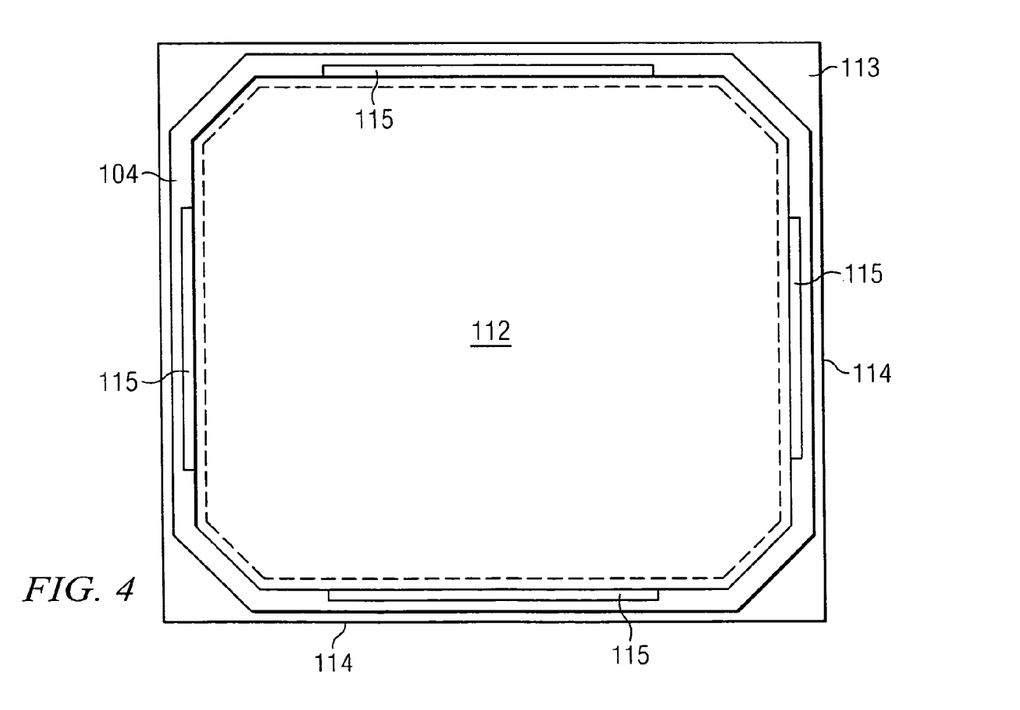
FIG. 4 is an illustration of an embodiment of the present application, showing a plan view of a semiconductor die that includes a capacitor integrated with the moisture barrier and/or crackstop.

FIG. 4 shows a plan view of a chip (or die or integrated circuit) that incorporates the preferred embodiment of the present application. The chip includes a circuit area 112 that is surrounded by a peripheral area 113. The peripheral area 113 extends to the edge 114 of the chip. Integrated circuitry, e.g., transistors, capacitors, diodes and others, are formed in the circuit area. These circuits perform the functions of the chip. In the preferred embodiment, no active circuitry is formed within the peripheral area 113. While it is understood that the peripheral area 113 may include alignment marks (see e.g., FIG. 1) or test structures or circuits, the circuits that perform the functions of the chip, with the exception of the function provided by the barrier, are provided in the circuit area 112.

At least one barrier 104 is formed within the peripheral area 113 and at least partially surrounds the circuit area 112. In the preferred embodiment, capacitor structures 115 are integrated into the barrier 104. In the preferred embodiment, the at least one barrier is the inner tower 104 of the moisture barrier 102. It is understood that in other embodiments, the capacitor(s) 115 can be integrated with other functional barriers, such as a crackstop 101 or outer barrier 103. The structure of FIG. 3 provides capacitance and also reduces the moisture barrier 102 functionality of the barrier 104.

Another embodiment of the present invention is to have capacitor 115 aligned along a portion of the inner boundary of the barrier 104. Thus, for instance, the capacitor 115 may be present only along one edge of the device, while the rest of the moisture barrier 104 remains unchanged (e.g., as shown in FIGS. 2 and 3). In various embodiments, the moisture barrier 102 functionality of such a structure will be higher than if the capacitor 115 is aligned all around the semiconductor device. Thus, there is a tradeoff between the moisture barrier 102 capacity of the tower 104 and its capacitive function, depending on the amount of the barrier structure that has been replaced with the capacitor structure 115.

Figure 5:
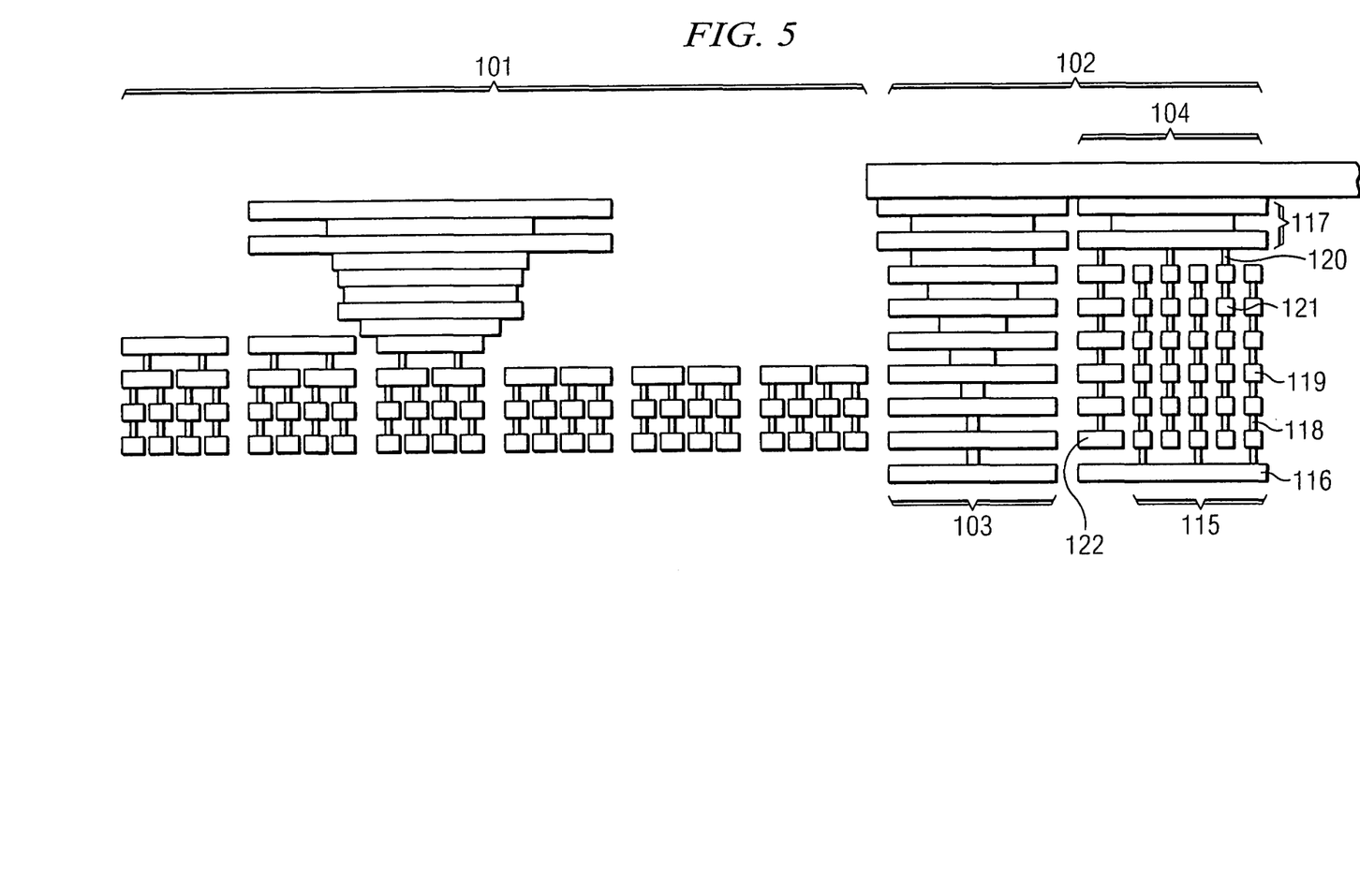
FIG. 5 is an illustration of the cross-sectional view of the crackstop and double tower moisture barrier, with the capacitor integrated with the moisture barrier and crackstop.

FIG. 5 shows a cross-sectional view of the crackstop 101 and double towers 103 and 104 of the moisture barrier 102, with the capacitor 115 integrated into 104. The capacitor 115 comprises a bottom electrode 116, and a top electrode 117, with metal lines and a dielectric in between. The bottom electrode 116 of the capacitor may be silicon, or polysilicon, or metal, depending on how deep a structure is desired. Thus, for instance, the capacitor 115 may extend all the way to the substrate, in which case, the bottom electrode 116 is silicon (or whatever other semiconductor material, e.g., silicon germanium, gallium arsenide, is used for the die). In another embodiment, the capacitor may extend only through some of the metallization stacks, and in such a case, the bottom electrode 116 is metal.

The top electrode 117 includes three metal levels in this illustration. For example, the bottom portion of the electrode 117 could be the uppermost metal interconnect line, e.g., the uppermost copper line. The middle portion can be an interconnect to an upper metal line, which forms the upper portion of the electrode 117. In some products, aluminum is used in the uppermost metal to accommodate interconnection to external devices (e.g., as the wire bond pads). Therefore, this embodiment is useful when the upper portion of the electrode 117 is the upper aluminum layer and the middle portion of the electrode 117 is the interconnect to the aluminum. In other embodiments, other metallization schemes could be used for the upper electrode 117 without deviating from the spirit of the invention.

The group of vias includes vias 118 that couple the metal lines 119, and vias 120 that couple the metal lines 121 on different planes of the device. In particular, vias 118 couple the metal lines 119 to the bottom electrode 116 while vias 120 couple the metal lines 121 to the top electrode 117, creating a capacitor structure.

The structure created using vias 118 and lines 119 is designated as the first stack of conductors, while the structure created using vias 120 and lines 121 is designated as the second stack of conductors. The capacitor thus comprises metal lines separated by dielectric, with the metal lines coupled by vias to a top and bottom electrode. Although not preferred, outer tower 103 could be electrically coupled to the top electrode 117 to become part of the capacitor structure. The moisture barrier 102 functionality of such a structure is lower than that of structure 103, but its capacitive function is considerably higher. The moisture barrier 102 capacity of the structure may be enhanced by providing for a continuous line of metal and via stack, 122, hereinafter "moisture barrier stack", as in 103, but which is electrically connected either to the top electrode 117 or the bottom electrode 116 (but not both). In this embodiment, the capacitor integrated into the surrounding structure, thus performs three functions: (1) prevents crack propagation, (2) acts as a barrier to moisture, and (3) is a capacitor.

Figure 6:
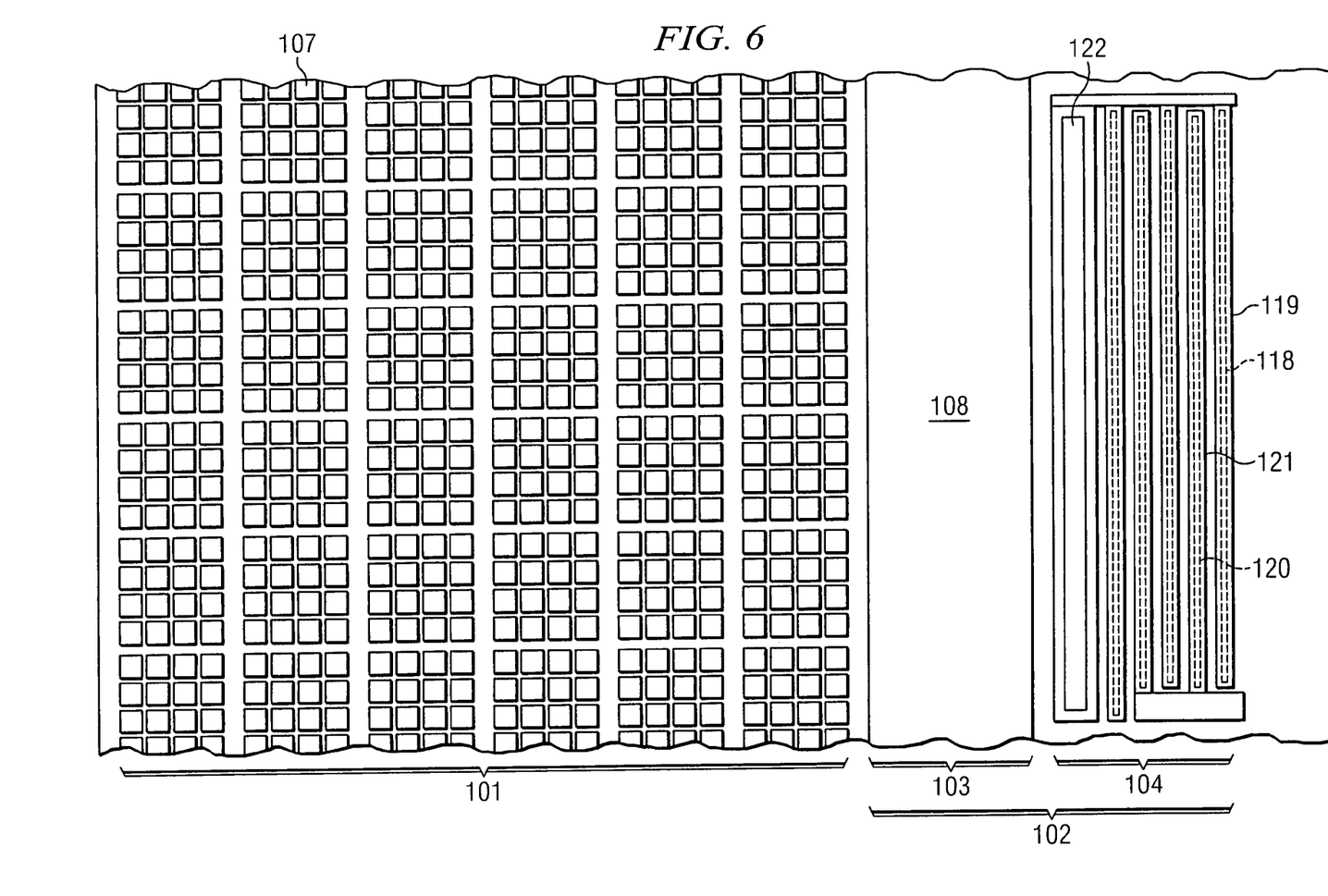
FIG. 6 is a plan view of a first embodiment crackstop and moisture barrier with an integrated capacitor structure.

FIG. 6 is a plan view of a first embodiment crackstop 101 and moisture barrier 102 with an integrated capacitor structure. The figure shows the metal lines or plates 107 in the crackstop 101, the line 108 in the moisture barrier 103 and continuous vias 118 and 120 in the integrated capacitor structure 115. The vias 118 and 120 in this embodiment are lines of approximately the same or similar length and possibly width as the metal lines 119 and 121 to which they are coupled. In other embodiments, the width of the vias 118 and 120 may vary from the width of lines 119 and 121 depending on process parameters used in creating the vias. Line 108 is an interconnect line of metal (or other conductor), typically of the same type used in the circuit area 112. The figure also shows the moisture barrier stack 122 from the top.

Figure 7:
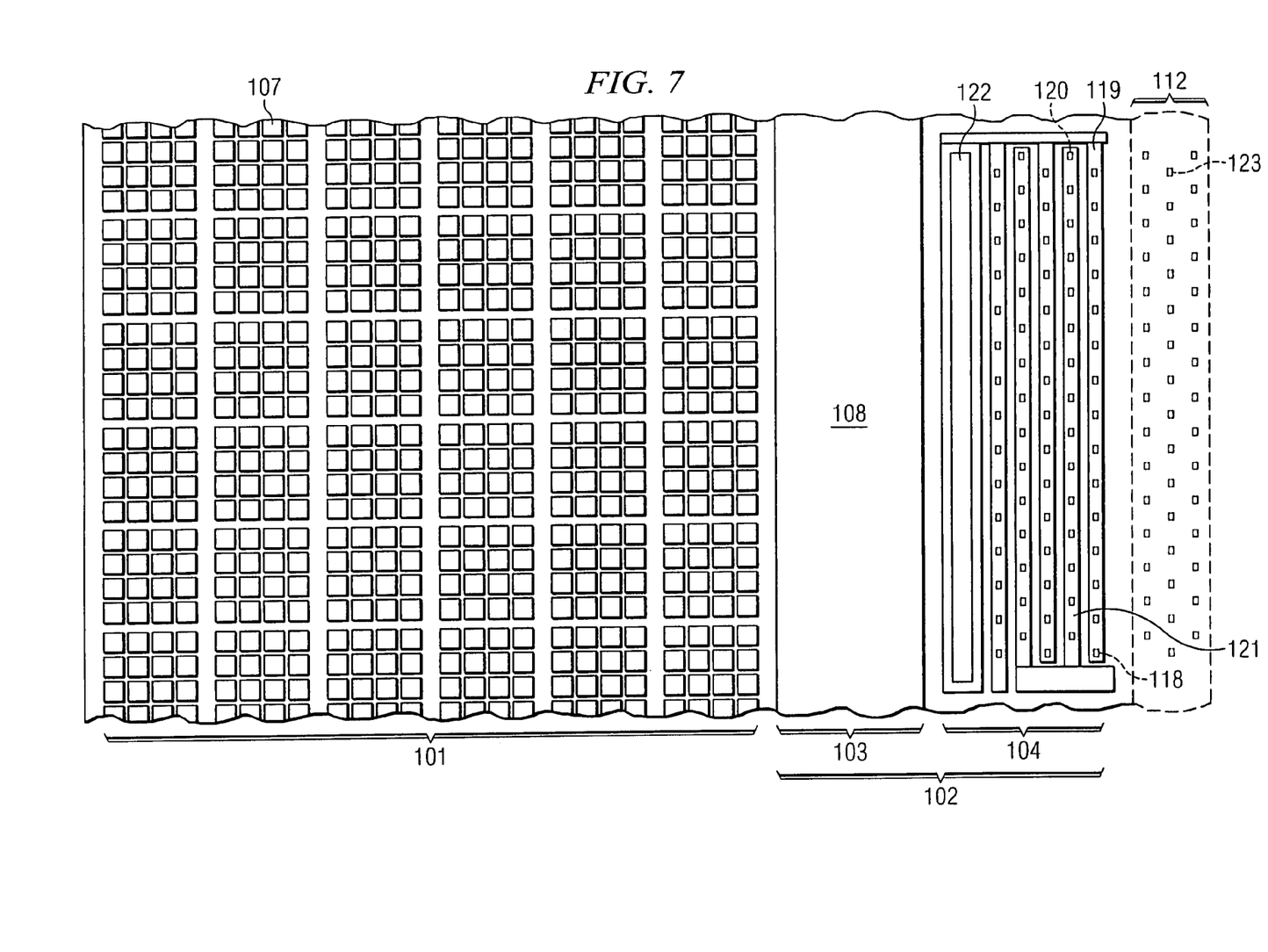
FIG. 7 is a plan view of a second embodiment crackstop and moisture barrier with an integrated capacitor structure.

The conductive plates 107 are coupled above and/or below with vias of the same type used to interconnect elements in the circuit area 112 (as shown in FIG. 4 or FIG. 7, for example). For example, the plates 107 can be of a dimension of about 0.5 μm×0.5 μm to 2 μm×2 μm. In other embodiments, other shapes and sizes could be used. Each of these plates 107 would be electrically connected to plates above and/or below with a set of vias. In one example, a three-by-three array of nine vias, each about 100 nm×100 nm, can couple adjacent plates that are each about 0.7 μm×0.7 μm.

FIG. 7 is a plan view of a second embodiment crackstop and moisture barrier with an integrated capacitor structure. The figure shows plates 107 in the crackstop 101, the line 108 in the moisture barrier 103 and the vias 118 and 120 in the integrated capacitor structure 115. The vias 118 and 120 in this embodiment are of the same length and width as the circuit area vias 123 in the circuit region 112 of the device. Thus, for example, vias 118 and 120 in between metal 1 and metal 2 will have the same size as circuit area vias 123 between metal 1 and metal 2 in the active region 112 of the device. This embodiment also allows for sizes of vias 118 and 120 to vary from level to level, as long as their size matches that of circuit area via 123 at the same level. Thus, for example, vias 118 and 120 may be larger in between metal 5 and metal 4 as compared to vias in between metal 1 and metal 2, but the vias size at each level matches that of circuit area vias 123 at the corresponding level. The vias (not shown) that couple the plates 107 can also be conventional vias.

Figure 8:
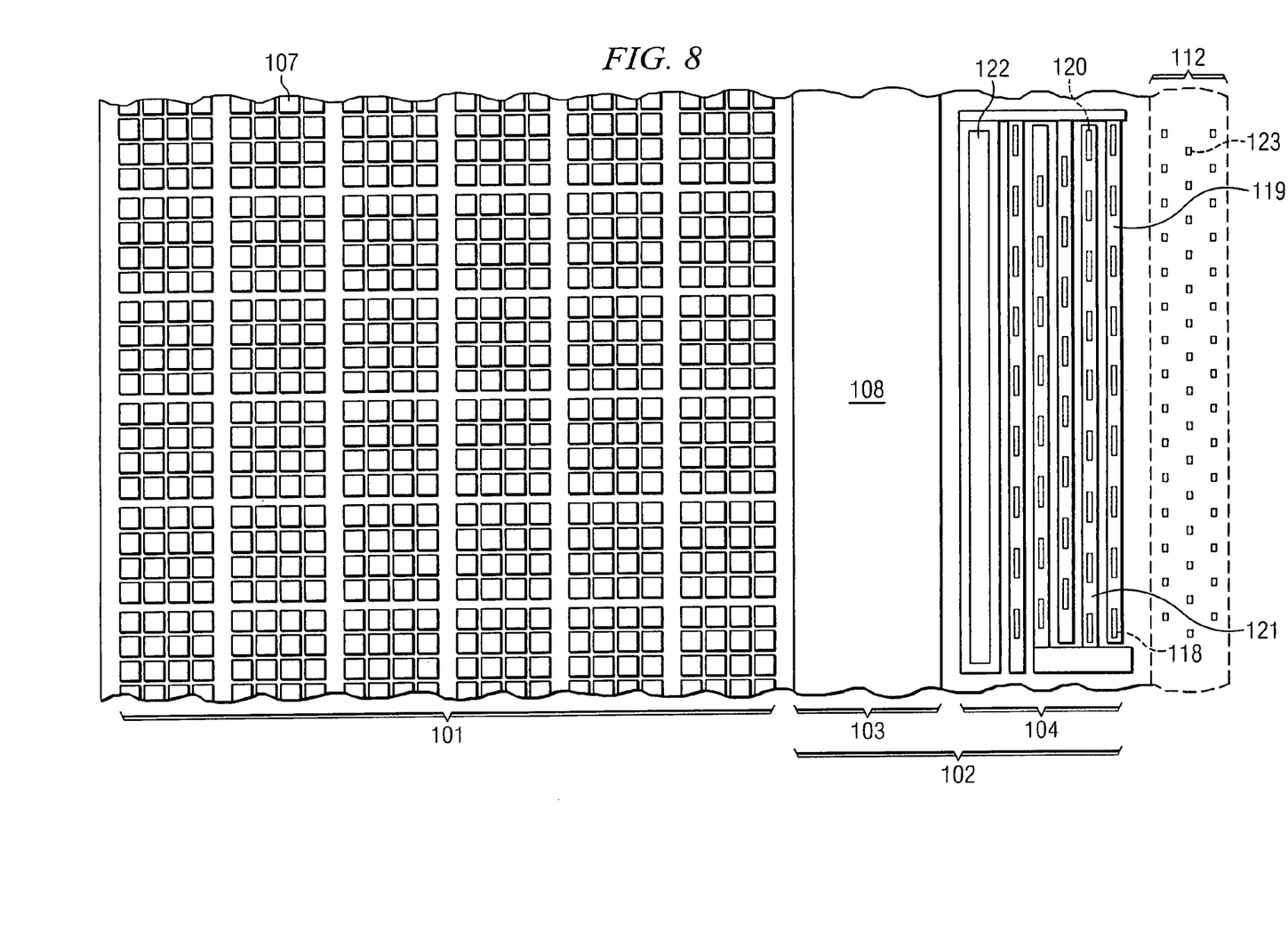
FIG. 8 is a plan view of a third embodiment crackstop and moisture barrier with an integrated capacitor structure.

FIG. 8 is a plan view of a third embodiment crackstop and moisture barrier with an integrated capacitor structure. The figure shows plates 107 in the crackstop 101, the line 108 in the moisture barrier 103 and the vias 118 and 120 in the integrated capacitor structure 115. The vias 118 and 120 in this embodiment are longer than vias 123 in the active region 112, but are not of the same length as the metal lines 119 and 121 to which they are connected. Thus, the vias 118 and 120 form discrete bars of metal instead of either continuous lines or square vias.

Figure 9:
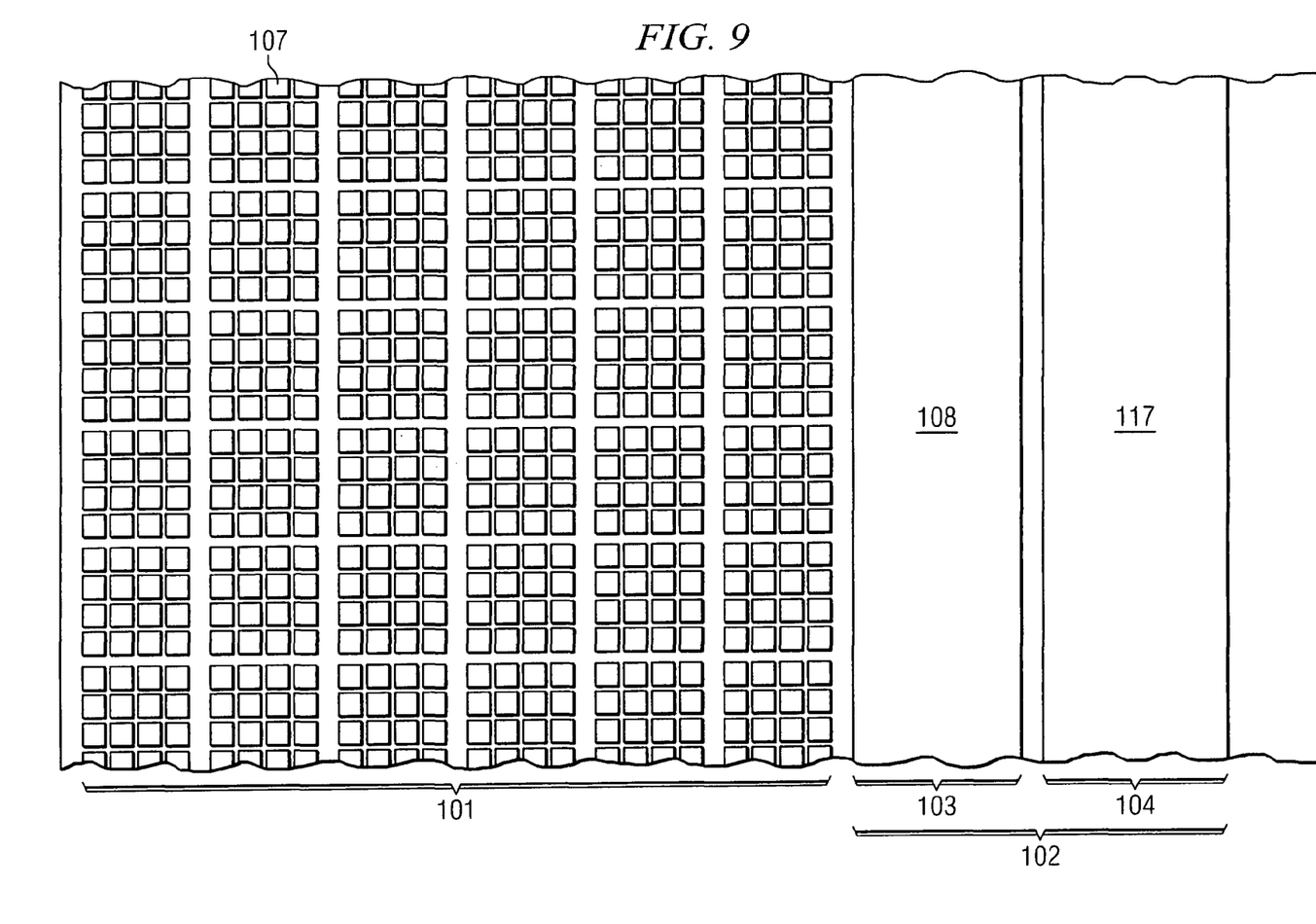
FIG. 9 is a plan view of a fourth embodiment crackstop and moisture barrier with an integrated capacitor structure.

FIG. 9 is a plan view of a fourth embodiment crackstop and moisture barrier with an integrated capacitor structure. The figure shows plates 107 in the crackstop 101, the line 108 in the moisture barrier 103 and the top electrode 117 of the integrated capacitor structure 115. In this embodiment, the top electrode 117 is a plate covering the capacitor structure 115. The bottom electrode 116 may also be a plate similar to the top electrode 117.

Figure 10:
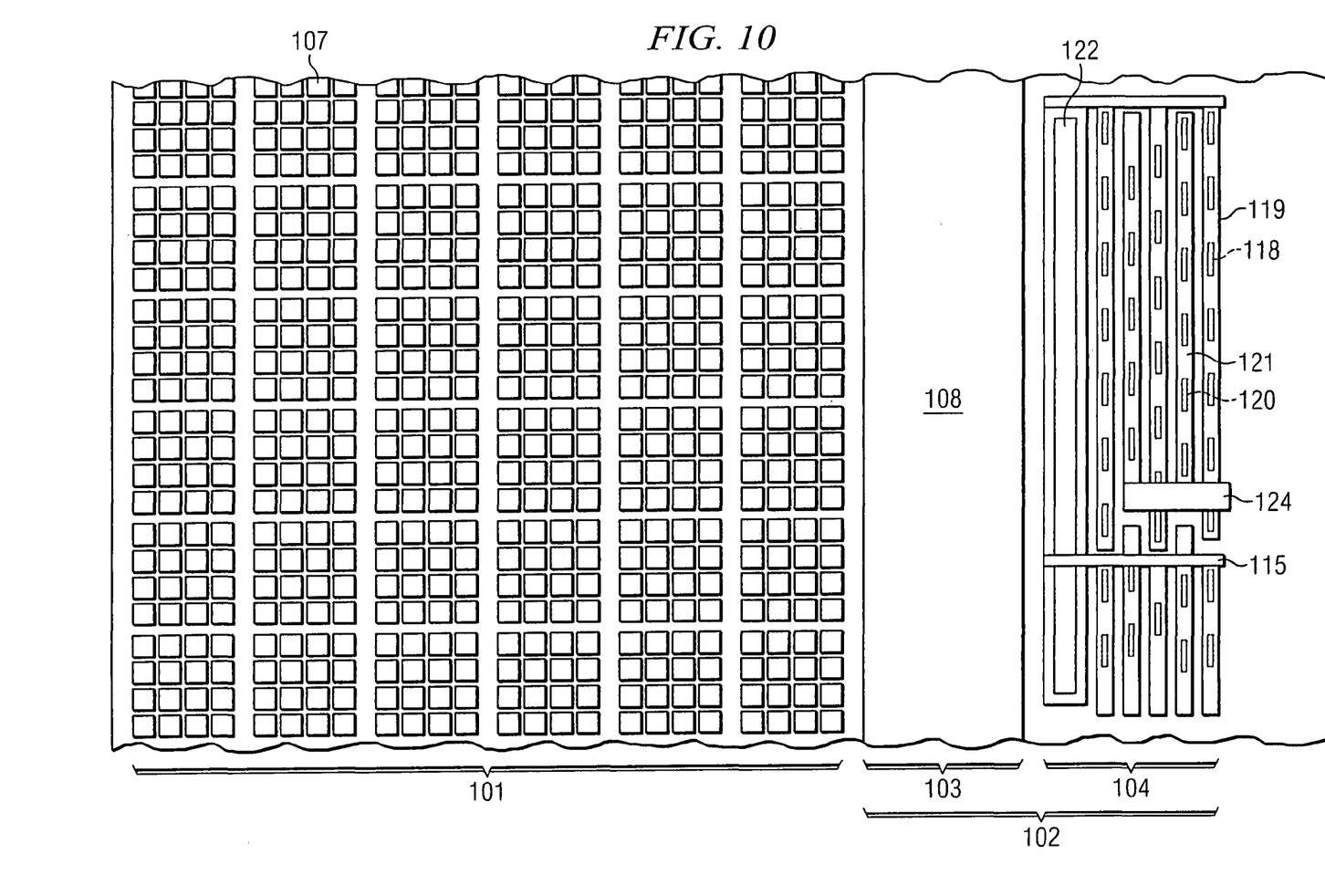
FIG. 10 is a plan view of a fifth embodiment crackstop and moisture barrier with an integrated capacitor structure.

FIG. 10 is a plan view of a fifth embodiment crackstop and moisture barrier with an integrated capacitor structure. The figure shows plates 107 in the crackstop 101, the moisture barrier 102 and integrated capacitor structure 115 in another embodiment of the application wherein the capacitors are discretized along a direction perpendicular to the thickness of the device. In this scenario, the metal lines 119 and 121 are not continuous around the periphery of the device, but are cut at some desired locations 124. Such a structure has the advantage of being placed anywhere along the moisture barrier 104 and does not need to be continuous in order to be functional. Further, several capacitors of different capacitance values can be formed by varying the lengths of the metal lines 119 and 121. Although the embodiment shows long vias 118 and 120, other via structures as mentioned earlier in FIGS. 6, 7 and 8 may also be used in conjunction with the severed metal lines 119 and 121.

Figure 11:
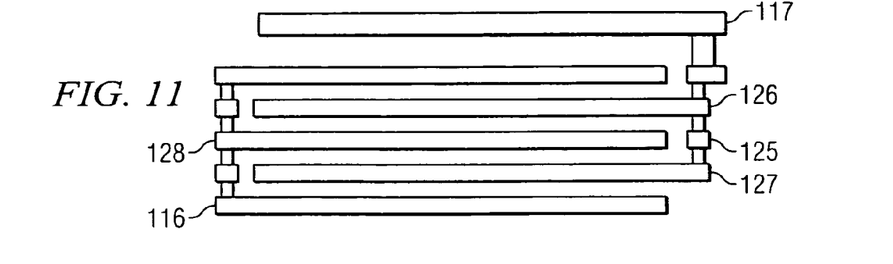
FIG. 11 is a cross-sectional schematic of an integrated sandwich capacitor in the crackstop.

FIG. 11 is a cross-sectional schematic of a sandwich capacitor in the barrier. In this embodiment, the bottom electrode 116 and top electrode 117 are plates. The stack of conductors includes alternating lines and plates. Each line 125 is coupled to a plate 126 immediately above it and a plate 127 immediately below it, while being disconnected from the plate 128 on the same level. This creates a capacitor with inter-digitized metal lines in cross sections, and plates in the plan view. This embodiment may encompass continuous lines and plates around the periphery of the device, or may be discretized by cutting the lines and plates at some desired locations, like the embodiment in FIG. 10. This embodiment may also comprise vias that are continuous, or bars, or other structures as mentioned earlier in FIGS. 6, 7, and 8.

Figure 12:
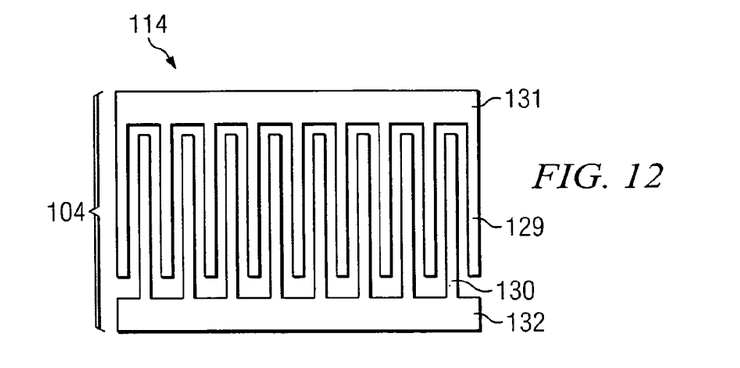
FIG. 12 is a top down schematic view of an integrated vertical parallel plate capacitor in the crackstop.

Another embodiment of the capacitor is shown in FIG. 12. In this embodiment, the capacitor is formed by inter-digitized lines 129 and 130 all the way through the thickness of the metallization layers. Thus, the capacitor comprises of vertical parallel plates of metal from the top of the device to the bottom of the capacitor structure, with the lines 119 and vias 118 being of the same shape. Similarly, lines 121 and vias 120 are also of the same shape and vias 118 comprise a line 131 parallel to the edge 114 of the device, and lines 129 perpendicular to 131. Similarly, lines 121 and vias 120 comprise a line 132 parallel to 131, and lines 130 perpendicular to 132, wherein lines 130 are inter-digitized with lines 129. This structure provides larger surface area through the thickness of the capacitor. The capacitor thus formed provides excellent moisture barrier protection in addition to capacitance. In one aspect of this embodiment, lines 131 and 132 may be continuous around the periphery of the device, or else may be present only at some desired locations along the barrier 104. In another aspect of this embodiment, the lines 131 and 132 may be discretized by cutting them at some desired locations, as mentioned in the embodiment in FIG. 10.

Figure 13:
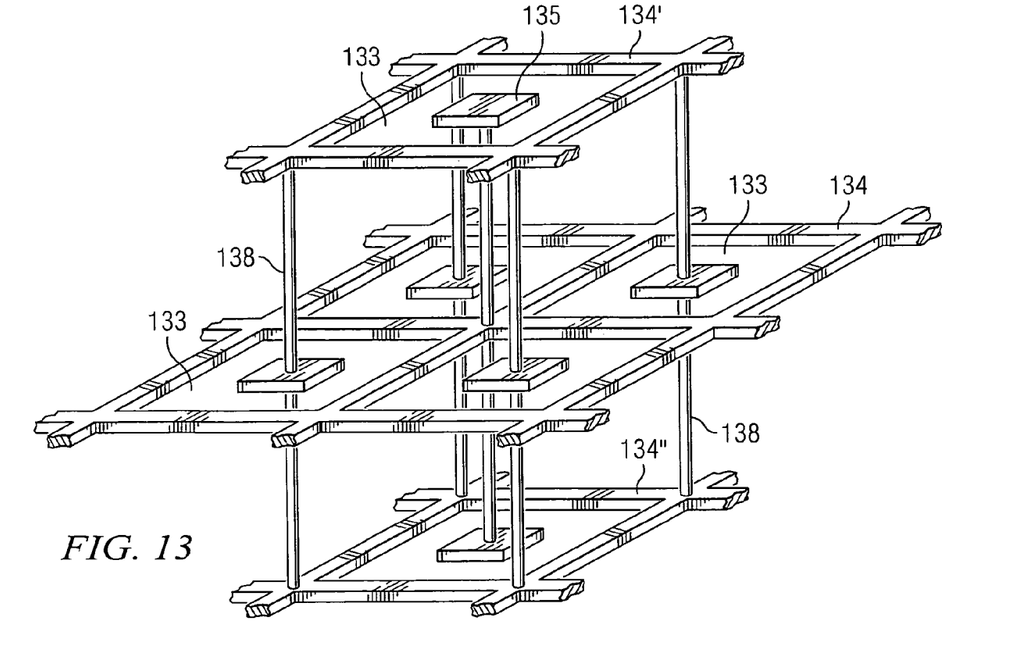
FIG. 13 is a schematic of an integrated cage capacitor in the crackstop.

One of the problems of the embodiment in FIG. 11 is that there may be a voltage drop across each plate. To prevent this voltage drop, the plates in each stack of conductors need to be coupled through more vias. This may be accomplished by forming holes 133 in the plates 134 (which are labeled as 134, 134' and 134"), so as to leave a block of the metal 135, like an island, in the middle of each hole 133, and coupling the block 135 to the plate 134 above it and below it by vias 138. This is shown in the schematic in FIG. 13. Each block of metal 135 is thus electrically insulated from the plate 134 within the same level of metal. Such a structure allows for electrical coupling between upper plate 134' and lower plate 134", while electrically insulating them from the plate 134 in between them. This structure forms a capacitor between plates 134 and 134' and another capacitor coupled in parallel between 134 and 134". The thus formed capacitor structure, which can be referred to as a cage capacitor, may have higher capacitance and more moisture barrier functionality than the capacitor in FIG. 4.

The capacitors thus formed by the various embodiments may have a variety of functions. The top and bottom electrodes may be coupled out to a bond pad on the semiconductor device. Such an embodiment may provide for decoupling capacitance within the chip itself, so there is no need to use an external capacitor for this purpose. Bond pad, as the term is used in this document, refers to a contact region on the semiconductor die that are used to couple the die to external structures, such as a package or a board. The pads may serve to attach solder balls or other means of electrical interconnection from the die to an external structure. The pads may also provide a means to test the device, e.g., for probing. Thus, the term bond pad is not restricted to pads used for wire-bonding alone.

In another embodiment, the top and bottom electrodes are coupled to the active circuitry itself. This may prove useful, for instance, in providing capacitance for a charge pump or to reduce noise. For example, U.S. patent application Ser. No. 11/112,851 (05P50199), which was filed Apr. 22, 2005 and is incorporated herein by reference, discloses a magnetoresistive random access memory (MRAM) circuit that includes a charge pump circuit electrically coupled to the memory circuit. In the preferred embodiment of that application, the memory circuit and at least a first portion of the charge pump circuit are fabricated on a single semiconductor chip while a second portion of the charge pump circuit, which includes a capacitor, is external to the semiconductor chip. Using the concepts of this invention, this "external" capacitor could be formed within the barrier (or crackstop or scribe seal).

In one aspect of the embodiment, a voltage supply line is connected to the top electrode and another voltage supply line or ground is connected to the bottom electrode to prevent noise or voltage fluctuations. The top and bottom electrodes can be electrically connected to any part of the active circuitry so as to function as a capacitor in the circuit.

The capacitor thus obtained may be used for a variety of purposes in the semiconductor device. It may be used between supplies to suppress noise and prevent voltage fluctuations; it may be used to serve logic-transistor functionality in analog circuits; it may be used as a capacitor for a charge pump depending on the chip size and requirement. It may also serve any other purpose for which a capacitor is used inside a semiconductor device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a chip including a circuit area surrounded by a peripheral area, the peripheral area extending to an edge of the chip;
   integrated circuitry within the circuit area, wherein no active circuit is disposed within the peripheral area; and
   a barrier within the peripheral area, the barrier at least partially surrounding the circuit area, wherein the barrier comprises:
      a bottom electrode,
      a top electrode capacitively coupled to the bottom electrode, and vertically spaced from the bottom electrode,
      a plurality of metallization layers lying in planes between the top electrode and the bottom electrode, and
      vias electrically coupling the metallization layers, wherein the vias are shorter in length than conductors in the metallization layers, wherein the length is measured along a line around the circuit area.

2. The integrated circuit of claim 1, wherein a first stack of conductors is formed from a first plurality of conductors each of which is in a different one of the metallization layers and is electrically coupled to the bottom electrode, and wherein a second stack of conductors is formed from a second plurality of conductors each of which is in a different one of the metallization layers and is electrically coupled to the top electrode such that at least a portion of a capacitor structure formed by the top and bottom electrodes is formed between the first stack of conductors and the second stack of conductors.

3. The integrated circuit of claim 1, wherein the vias are a same length and width as vias in the circuit area.

4. The integrated circuit of claim 2, wherein the top electrode comprises a conductive plate and wherein the bottom electrode comprises a conductive plate.

5. The integrated circuit of claim 4, wherein each stack of conductors is formed from vertically alternating lines and plates, each line being electrically coupled to a plate above it and a plate below it.

6. The integrated circuit of claim 4, wherein each stack of conductors between the top electrode and the bottom electrode is formed from a plurality of plates, each plate comprising:
   a plurality of holes surrounding blocks of conductive metal in the same plane;
   each block being completely surrounded by one hole of the plurality of holes, so as to be electrically insulated from the plate; and
   each block being electrically coupled to the plate above it and the plate below it.

7. The integrated circuit of claim 2, wherein the top electrode comprises a plurality of conductive lines that are electrically coupled by at least one conductive line and wherein the bottom electrode comprises a plurality of conductive lines that are electrically coupled by at least one conductive line.

8. The integrated circuit of claim 7, wherein the bottom electrode is of a same shape as the first stack of conductors, and the top electrode is of a same shape as the second stack of conductors and further, wherein each shape comprises:
   a first line parallel to the edge of the chip; and
   a plurality of lines coupled to the first line and perpendicular to the first line, wherein each line in the plurality of lines of the first stack of conductors alternates with each line of the plurality of lines of the second stack of conductors so as to form inter-digitized lines that provide capacitance.

9. The integrated circuit of claim 7, wherein the conductive lines on the electrodes and the stacks of conductors comprise discontinuous line segments.

10. An integrated circuit comprising:
    a chip including a circuit area surrounded by a peripheral area, the peripheral area extending to an edge of the chip;
    integrated circuitry within the circuit area, wherein no active circuit is disposed within the peripheral area; and
    a barrier within the peripheral area, the barrier at least partially surrounding the circuit area, wherein the barrier includes a capacitor structure integrated therein, wherein the barrier comprises:
       a bottom electrode,
       a top electrode vertically spaced from the bottom electrode, and a plurality of metallization layers lying in planes between the top electrode and the bottom electrode, wherein a first stack of conductors is formed from a first plurality of conductors each of which is in a different one of the metallization layers and is electrically coupled to the bottom electrode, wherein a second stack of conductors is formed from a second plurality of conductors each of which is in a different one of the metallization layers and is electrically coupled to the top electrode such that at least a portion of the capacitor structure is formed between the first stack of conductors and the second stack of conductors, wherein a third stack of conductors is formed from a third plurality of conductors each of which is in a different one of the metallization layers and is electrically coupled to the bottom electrode, and wherein a fourth stack of conductors is formed from a fourth plurality of conductors each of which is in a different one of the metallization layers and is electrically coupled to the top electrode.

11. The integrated circuit of claim 10, further comprising a fifth stack of conductors formed from a fifth plurality of conductors each of which is in a different one of the metallization layers and is electrically coupled to one of the top or the bottom electrodes.

12. An integrated circuit comprising:
a chip including a circuit area surrounded by a peripheral area, the peripheral area extending to an edge of the chip;
integrated circuitry within the circuit area, wherein no active circuit is disposed within the peripheral area;
a barrier within the peripheral area, the barrier at least partially surrounding the circuit area, wherein the barrier includes a first electrode coupled to the integrated circuitry and a second electrode coupled to the integrated circuitry; and
a first voltage supply line within the circuit area and a second voltage supply line within the circuit area, wherein the first electrode is coupled to the integrated circuitry via the first voltage supply line and the second electrode is coupled to the integrated circuitry via the second voltage supply line.

13. The integrated circuit of claim 12, wherein the barrier capacitively couples the first voltage supply line with the second voltage supply line.

14. The integrated circuit of claim 12, wherein at least one of the first electrode and/or the second electrode is electrically coupled to pads on the integrated circuit.

15. The integrated circuit of claim 12, wherein the barrier comprises a double barrier, including a first barrier and a second barrier that is between the first barrier and the circuit area, wherein the second barrier includes a capacitor structure between the first electrode and the second electrode.

16. The integrated circuit of claim 14, wherein the first electrode is electrically coupled to a pad on the integrated circuit and the second electrode is coupled to a supply voltage line.

17. The integrated circuit of claim 15, wherein the first and second barriers comprise a moisture barrier.

18. The integrated circuit of claim 17, further comprising a crackstop surrounding the moisture barrier.

19. An integrated circuit comprising:
a substrate including a circuit area surrounded by a peripheral area, the peripheral area extending to an edge of the substrate;
integrated circuitry within the circuit area, wherein no active circuit is disposed within the peripheral area; and
a barrier within the peripheral area and surrounding the circuit area, the barrier comprising a first electrode, a second electrode, and means for providing capacitance between the first electrode and the second electrode, wherein the first electrode is electrically coupled to a first voltage supply line which is connected to the integrated circuitry in the circuit area and the second electrode is electrically coupled to a second voltage supply line which is connected to the integrated circuitry in the circuit area.

20. A method of forming an integrated circuit, the method comprising:
providing a substrate including a circuit area surrounded by a peripheral area, the peripheral area extending to an edge of the substrate;
forming integrated circuitry within the circuit area wherein no active circuit is disposed within the peripheral area; and
forming a barrier within the peripheral area and surrounding the circuit area, the barrier including a capacitor structure therein, wherein forming the barrier comprises:
forming a bottom electrode, and
forming a plurality of conductive lines on metallization layers above the bottom electrode, wherein the plurality of conductive lines is discontinuous along the barrier surrounding the circuit area.

21. The method of claim 20, wherein forming the barrier further comprises:
forming a plurality of vias connecting the metallization layers;
forming a top electrode above the plurality of metallization layers and vertically spaced from them; and
electrically coupling the electrodes and the metallization layers such that a first stack of conductors is formed from a plurality of conductive lines each of which is in a different one of the metallization layers and is electrically coupled to the bottom electrode, and wherein a second stack of conductors is formed from a plurality of conductive lines each of which is in a different one of the metallization layers and is electrically coupled to the top electrode such that a capacitor is formed between the first stack of conductors and the second stack of conductors.

22. The method of claim 20, wherein forming the integrated circuitry comprises electrically coupling a plurality of transistors through interconnect lines and vias, wherein the barrier is formed simultaneously with the interconnect lines and vias.

23. The method of claim 20, wherein forming the barrier comprises forming a barrier with a vertical plate capacitor integrated therein.

24. The method of claim 20, wherein forming the barrier comprises forming a barrier with a sandwich capacitor integrated therein.

25. A method of forming an integrated circuit, the method comprising:
providing a substrate including a circuit area surrounded by a peripheral area, the peripheral area extending to an edge of the substrate;
forming integrated circuitry within the circuit area wherein no active circuit is disposed within the peripheral area; and
forming a barrier within the peripheral area and surrounding the circuit area, the barrier including a capacitor structure therein, wherein forming the barrier comprises forming a barrier with a cage integrated therein.

* * * * *